United States Patent

Vahlstrom et al.

[15] 3,675,047

[45] July 4, 1972

[54] PRECISION PULSE GENERATOR

[72] Inventors: Richard E. Vahlstrom, Villa Park; Donald C. Nutten, Newport Beach; Dennis R. Bayne, Placentia, all of Calif.

[73] Assignee: Northrop Corporation, Los Angeles, Calif.

[22] Filed: June 7, 1971

[21] Appl. No.: 150,376

[52] U.S. Cl...............................307/260, 307/263, 307/265, 307/268, 307/269, 307/293, 328/60, 328/61, 328/63

[51] Int. Cl..........................................H03k 5/00, H03k 5/04

[58] Field of Search..................307/260, 263, 265, 268, 269; 328/59–63

[56] References Cited

UNITED STATES PATENTS

| | | | |
|---|---|---|---|
| 3,054,959 | 9/1962 | Colagrossi et al. | 307/263 X |
| 3,311,752 | 3/1967 | Foppes | 307/268 |
| 3,312,837 | 4/1967 | Flynn et al. | 307/263 X |
| 3,402,353 | 9/1968 | Hubbs | 307/263 X |
| 3,443,232 | 5/1969 | Stinson, Jr. | 307/268 X |
| 3,444,394 | 5/1969 | Colvson | 307/263 X |

*Primary Examiner*—Stanley D. Miller, Jr.
*Attorney*—William W. Rundle and Willard M. Graham

[57] ABSTRACT

The square wave output of a crystal clock pulse generator is operated on by logic circuitry to start a ramp generator exactly at the beginning of one clock pulse. The signal which started this ramp generator is delayed for a predetermined time and then used to start an identical ramp generator exactly at the beginning of a later clock pulse. Outputs of the ramp generators are fed respectively to the opposite-polarity inputs of a difference amplifier, so that the amplifier output is a pulse started by the first ramp generator and stopped by starting of the second ramp generator, and the output pulse width is a precise multiple of the clock pulse period. Calibrating circuitry, when actuated, bypasses the delay function and allows comparison of the two ramp generator outputs simultaneously. If they are equal as they should be, the output of the difference amplifier is a straight line.

6 Claims, 3 Drawing Figures

INVENTORS:
Richard E. Vahlstrom
Donald C. Nutten
Dennis R. Bayne

By William W. Rundle
AGENT

INVENTORS:
Richard E. Vahlstrom
Donald C. Nutten
Dennis R. Bayne

By William W. Rundle
AGENT

PRECISION PULSE GENERATOR

The present invention relates to electrical pulse generation, and more particularly, to the precise generation of a short pulse whose width is exactly controlled by a crystal clock generator.

In electrical waveform analysis, various types of pulse sensors are required to be calibrated in order that they will have an accurate output. If a precision pulse were available to apply to the sensors, the required output adjustments could be made on the sensors to calibrate them. It is an object of this invention to a precise pulse generator for producing a pulse having exact known rise time, fall time, width and amplitude.

In the area of radar system waveform measurements and testing, for example, short pulses of only several nanoseconds must be measured. Therefore, an additional object of the present invention is to provide a precision pulse generator for producing a pulse having a rise time, fall time, and width in the nanosecond region.

Briefly, our invention comprises a clock pulse generator, a first ramp generator called a rise time generator, first gate means between the clock generator and rise time generator, time delay means started by the same clock pulse which starts the rise time generator, a second ramp generator called a fall time generator, means for gating to the fall time generator a starting pulse signal upon arrival of the very next clock pulse following the expiration of the time delay, and a combining circuit connected to the outputs of the ramp generators to generate an output pulse starting with the start of the rise time generator and ending with the start of the fall time generator. Calibration means is also provided for checking the internal timing of the generator.

This invention may be more fully understood from the description of specific apparatus to follow, and by reference to the accompanying illustrative drawings.

Figure 1:
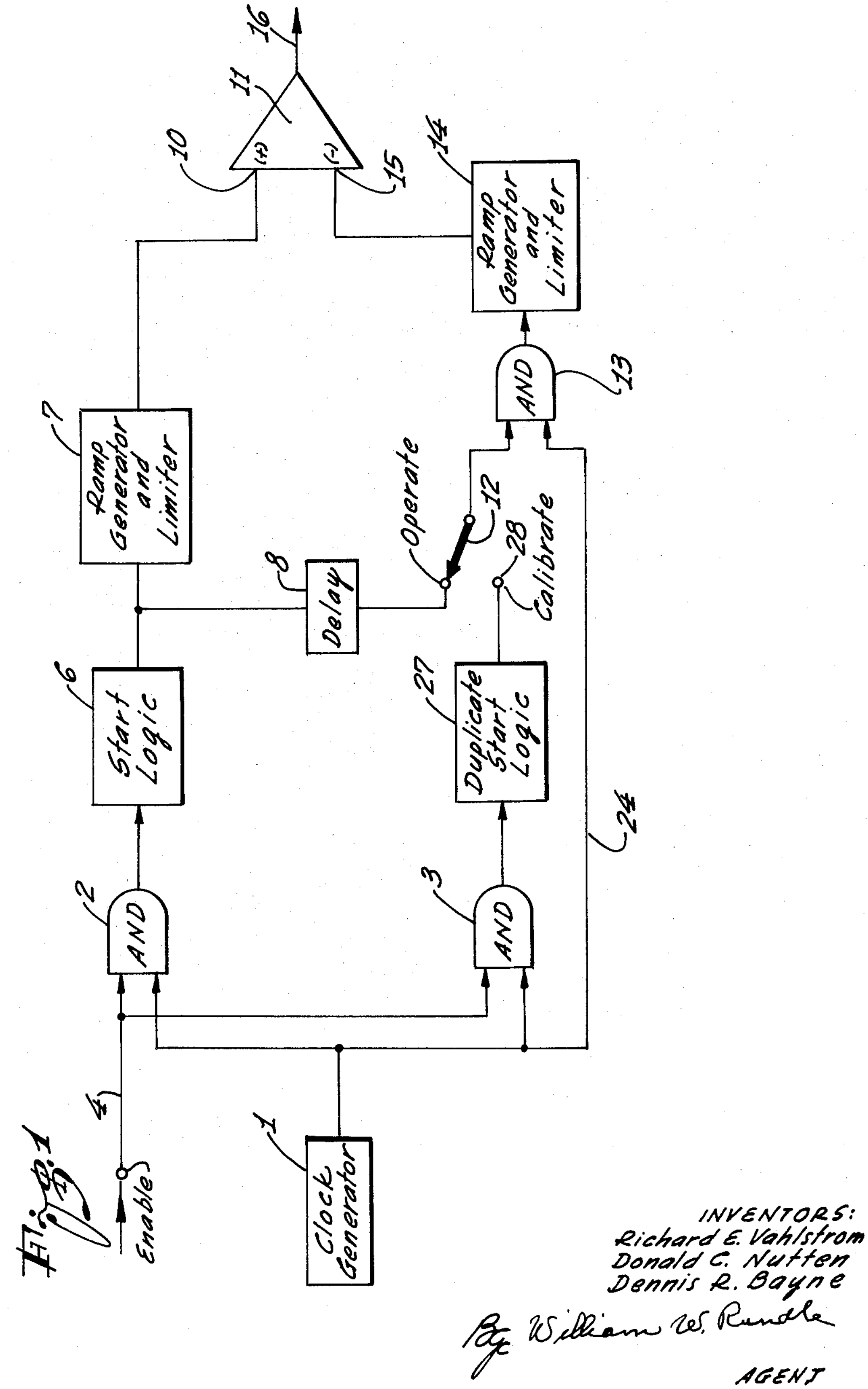
FIG. 1 is a block diagram of the precision pulse generator.

Referring to FIG. 1, this invention uses a crystal-controlled square wave oscillator as a clock pulse generator 1. Clock pulses are fed from clock generator 1 to one input of each of two AND gates 2 and 3. A gate enable line 4 is connected to the remaining input of each AND gate 2 and 3.

From the first AND gate 2, start logic circuit 6 connects to the input of a rise time ramp generator 7 and to the input of a time delay circuit 8. The output of the rise time generator 7 is connected to the non-inverting input 10 of a differential amplifier 11. The delayed output passes through a calibration switch 12 to a third AND gate 13 and from thence to a fall time ramp generator 14 identical to the rise time ramp generator 7. Ramp generators 7 and 14 also include limiting means which clamp the output amplitudes at equal levels. The output of fall time ramp generator 14 connects to the inverting input 15 of the differential amplifier 11. The amplifier output line 16 carries the desired precision output pulse.

In operation, a sequence of events is started by a negative-going enable pulse 18 (FIG. 2) on the gate enable line 4. The start logic 6 assures that the rise time ramp generator 7 will be turned on by a positive excursion of a clock pulse 19. This logic circuit 6 is of any suitable design, and may be the circuit shown in FIG. 3, where transistor Q1 serves both as the gate 2 and the first portion of the start logic 6. The time delay circuit 8 is started at the same time as the rise time ramp signal 20 begins, as indicated by the delay waveform 21. This time delay may be a one-shot multivibrator so designed that its "on" time is just slightly less than the desired width of the output pulse 23. Therefore, when the next clock pulse arrives on pulse line 24 (FIG. 1) to the third AND gate 13 after the one-shot multivibrator has returned to its original stable state, the third AND gate 13 will have an output which starts the fall time ramp generator 14.

Figure 2:
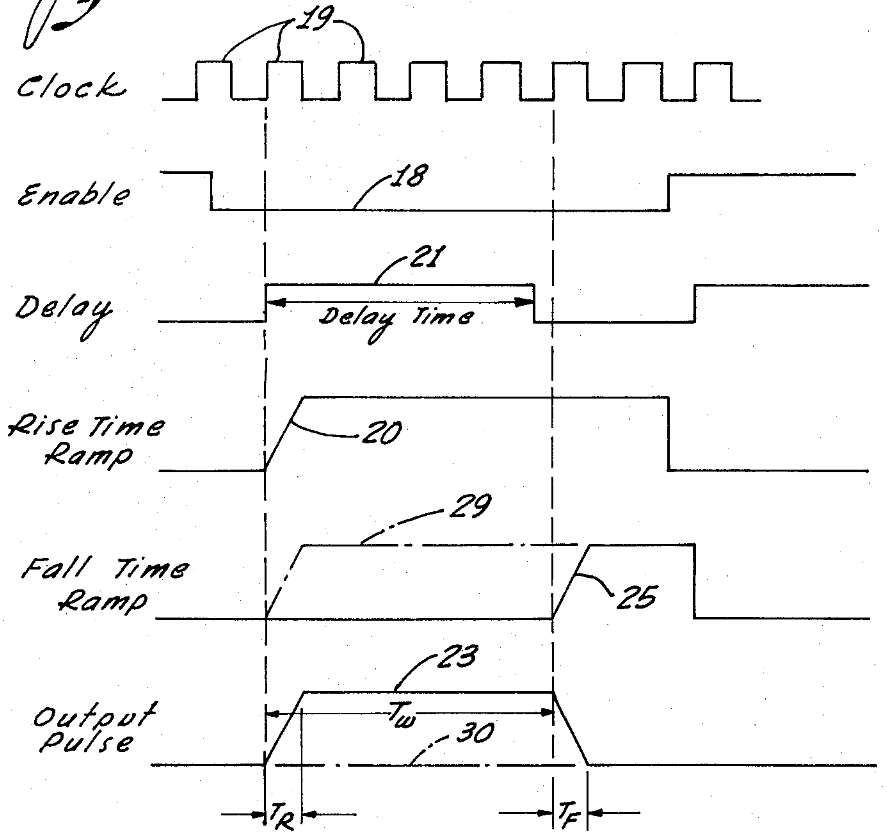
FIG. 2 is a timing diagram of the present generator showing the relation of various internal waveforms.
Figure 3:
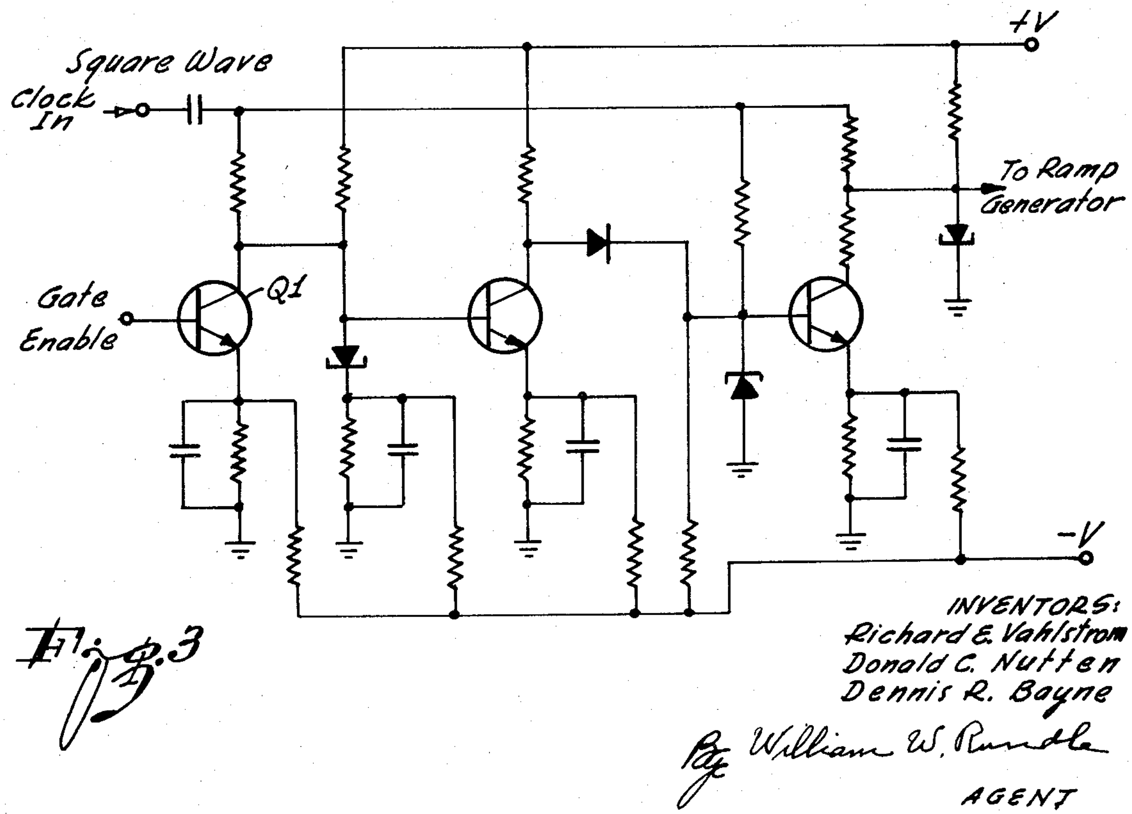
FIG. 3 is a schematic diagram showing a start logic circuit as used in the present invention.

The fall time ramp waveform 25 is shown in FIG. 2, having the same rise time as the rise time ramp waveform 20. It will thus be seen that the amplifier output line 16 carries the desired generated output pulse 23 since the fall time ramp 25 is subtracted from the rise time ramp signal 20 in the differential amplifier 11. The width of output pulse 23 in this example is exactly four clock pulse periods. By adjusting the period of time delay circuit 8, the time interval between the rise time ramp 20 and the fall time ramp 25 may be changed in steps equal to integral multiples of the clock pulse period. The two ramp generators 7 and 14 have adjustments so that the rate of rise of each is the same. Also the clamped amplitude is the same for each.

The present device may be calibrated as follows. A duplicate start logic circuit 27 is connected to the output of second AND gate 3, and the output of the duplicate logic circuit 27 is connected through a "calibrate" position 28 of the calibration switch 12. The duplicate start logic 27 is identical to the first start logic circuit 6. When operating in the "calibrate" position 28, it will be seen that identical outputs of the two ramp generators 7 and 14 should occur simultaneously at the difference amplifier 11. The output signal from the amplifier 11 will therefore be a horizontal straight line of zero amplitude. If it is not, ramp generator and limiter adjustments can be made to produce the straight line. In FIG. 2, phantom lines 29 and 30 are given to show the proper waveforms during calibration.

It is thus seen that a precision pulse generator has been provided which produces an output pulse having exactly known properties. A typical output pulse generated by this equipment has an amplitude of five volts, for example, a width of 300 nanoseconds or less, for example, and rise and fall times of 50 nanoseconds, for example. Various modifications may be made to the apparatus disclosed and described herein without departing from the gist of the present invention. The gating and logic may be performed by other equivalent circuitry, and the time delay may be provided by circuitry other than a one-shot multivibrator. The fact that the ramp generators were started by a positive excursion of the clock pulse need not be a restriction, since obviously a ramp generator could be started (and stopped) with a negative-going voltage instead.

While in order to comply with the statute, the invention has been described in language more or less specific as to structural features, it is to be understood that the invention is not limited to the specific features shown, but that the means and construction herein disclosed comprise the preferred form of putting the invention into effect, and the invention is therefore claimed in any of its forms or modifications within the legitimate and valid scope of the appended claims.

What is claimed is:

1. A precision pulse generator comprising a square wave clock pulse generator, a rise time ramp generator, gating and logic means connected between said clock pulse generator and said rise time ramp generator for starting said ramp generator at the beginning of a clock pulse only, time delay means connected to the input of said rise time ramp generator to be started simultaneously therewith, the delay period of said time delay means being slightly less than an integral number of clock pulse periods, a fall time ramp generator, gate means connected from the output of said time delay means and said clock pulse generator to the input of said fall time ramp generator for starting said latter ramp generator exactly at the beginning of the next clock pulse immediately following the expiration of said delay period, amplitude limiting means for clamping the output levels of said ramp generators at predetermined identical magnitudes, and combining means connected to the outputs of said ramp generators for producing an output pulse starting with the start of said rise time ramp generator and ending with the start of said fall time ramp generator.

2. Apparatus in accordance with claim 1 wherein said rise time ramp generator and said fall time ramp generator have equal rates of rise of output voltage.

3. Apparatus in accordance with claim 1 wherein said combining means comprises a differential amplifier, said rise time ramp generator being connected to one of the inputs of said differential amplifier, and said fall time ramp generator being connected to the other input of said differential amplifier, whereby the output of said amplifier is a pulse having the rise time of said rise time ramp generator, the fall time of said fall time ramp generator, and a width equal to an integral number of said clock pulse periods.

4. Apparatus in accordance with claim 1 wherein said clock pulse generator is a crystal-controlled square wave oscillator.

5. Apparatus in accordance with claim 1 including gate enabling means connected to the input of said gating and logic means for initiating generation of said output pulse.

6. Apparatus in accordance with claim 1 including calibrating means which comprises second gating and logic means identical to the first said gating and logic means also connected to said clock pulse generator, and switching means connected in said time delay means output for selectively connecting said fall time ramp generator either to said time delay means for normal operation or to said second gating and logic means for calibration, whereby when said switching means is in the calibration position and said ramp generators are identical, the output from said combining means is constantly zero.

* * * * *